(12) United States Patent
Gasworth

(10) Patent No.: US 9,950,481 B2
(45) Date of Patent: Apr. 24, 2018

(54) EDGE HEALING AND FIELD REPAIR OF PLASMA COATING

(75) Inventor: Steven M. Gasworth, Novi, MI (US)

(73) Assignee: EXATEC LLC, Wixom, MI (US)

( * ) Notice: Subject to any disclaimer, the term of this patent is extended or adjusted under 35 U.S.C. 154(b) by 1471 days.

(21) Appl. No.: 12/113,839

(22) Filed: May 1, 2008

(65) Prior Publication Data

US 2009/0324850 A1 Dec. 31, 2009

Related U.S. Application Data

(60) Provisional application No. 60/915,232, filed on May 1, 2007.

(51) Int. Cl.
| | | |
|---|---|---|
| *B29C 73/00* | (2006.01) | |
| *C23C 16/00* | (2006.01) | |
| *B29C 73/02* | (2006.01) | |
| *C23C 16/04* | (2006.01) | |
| *C23C 16/40* | (2006.01) | |
| *C23C 16/513* | (2006.01) | |
| *B29L 31/30* | (2006.01) | |

(52) U.S. Cl.
CPC ............. *B29C 73/02* (2013.01); *C23C 16/04* (2013.01); *C23C 16/401* (2013.01); *C23C 16/513* (2013.01); *B29L 2031/3052* (2013.01); *Y02T 50/67* (2013.01)

(58) Field of Classification Search
CPC .................................................. B29C 73/025
USPC ........................................ 427/488, 533, 534
See application file for complete search history.

(56) References Cited

U.S. PATENT DOCUMENTS

| | | | | |
|---|---|---|---|---|
| 3,900,655 | A * | 8/1975 | Wolgemuth et al. | 428/214 |
| 3,993,520 | A * | 11/1976 | Werner | B29C 73/025 156/103 |
| 4,776,298 | A * | 10/1988 | Nied | 118/720 |
| 4,842,941 | A * | 6/1989 | Devins | B05D 1/62 427/162 |
| 5,320,875 | A * | 6/1994 | Hu | C23C 16/30 427/255.37 |
| 5,512,116 | A * | 4/1996 | Campfield | 156/94 |
| 6,180,245 | B1 | 1/2001 | Janssen et al. | |
| 6,183,678 | B1 * | 2/2001 | Kusuma | B05C 13/00 264/138 |
| 6,875,303 | B2 * | 4/2005 | Samurkas et al. | 156/272.6 |
| 7,703,413 | B2 | 4/2010 | Miebach et al. | |
| 2004/0263083 | A1 * | 12/2004 | Schaepkens | 315/111.21 |

(Continued)

FOREIGN PATENT DOCUMENTS

| | | |
|---|---|---|
| EP | 1 749 583 | 2/2007 |
| WO | WO 00/78520 A1 * | 12/2000 |

(Continued)

OTHER PUBLICATIONS

International Search Report and Written Opinion of PCT/US2008/062283.

(Continued)

*Primary Examiner* — Francisco W Tschen
(74) *Attorney, Agent, or Firm* — Cantor Colburn LLP

(57) ABSTRACT

Described are processes for repairing plastic glazing and for the local application of a plasma coating using a plasma depositing device to an edge created by the removal of excess or unwanted plastic from plastic.

9 Claims, 2 Drawing Sheets

(56) References Cited

U.S. PATENT DOCUMENTS

| | | | |
|---|---|---|---|
| 2005/0202184 A1* | 9/2005 | Iacovangelo | C23C 16/513 427/569 |
| 2006/0041437 A1* | 2/2006 | LaVigne et al. | 705/1 |
| 2006/0091119 A1 | 5/2006 | Zajchowski et al. | |
| 2007/0065582 A1* | 3/2007 | Haack et al. | 427/255.18 |

FOREIGN PATENT DOCUMENTS

| | | | | |
|---|---|---|---|---|
| WO | WO 2006002429 A2 * | 1/2006 | | |
| WO | WO 2006036461 A1 * | 4/2006 | | B05D 1/62 |

OTHER PUBLICATIONS

Korevaar, B. A., "Integration of Expanding Thermal Plasma Deposited Hydrogenated Amorphous Silicon in Solar Cells", Doctoral Thesis, Eindhoven University of Technology, 2002, 115 pages.

International Preliminary Report on Patentability for International Application No. PCT/US2008/062283, International Filing Date May 1, 2008, dated Apr. 23, 2009, 5 Pages.

* cited by examiner ic resin. The thermoplastic resins of the present invention
EDGE HEALING AND FIELD REPAIR OF PLASMA COATING

CROSS REFERENCE TO RELATED APPLICATION

This application claims the benefit of U.S. Provisional Application Ser. No. 60/915,232 filed on May 1, 2007 which is hereby incorporated by reference.

BACKGROUND OF THE INVENTION

The use of plastic glazing is well known, for example in the automotive industry they may be used for windows, headlamps, and tail lights. In the process of manufacturing such plastic glazing, a plastic substrate generally is coated with a weatherable layer which is optionally over-coated via the deposition of an abrasion resistant layer. This abrasion resistant layer may be a plasma coating which is generally deposited in deposition chamber at sub-atmospheric pressure.

In the manufacture of plastic glazing, it may be desirable to mold the plastic substrate with tabs to facilitate the handling of the glazing during the manufacturing process. The plastic glazing may also have gates, associated with the molding process, along the edge of the molded plastic. These tabs or gates are typically removed from the glazing before its final use. If the glazing is thermoformed rather than molded there maybe excess plastic at the perimeter that would generally be removed after a plasma coating is applied. After removing the tabs, gates or excess plastic, an edge is left which is not coated with a weatherable layer or a plasma coating. The current common practice is to leave the edge uncoated or treat the edge by wet coating. The absence of coating or the presence of wet coating on the edge can cause problems with the application of subsequently applied adhesive or encapsulation because the uncoated plastic or the wet coat is different from the rest of the glazing. Practical and feasible processes for local plasma coating are needed to address these problems.

Another problem that may be encountered with plastic glazing is that during their use, for example as windows in an automobile, the plasma coating layer may be chipped. The resulting surface damage is undesirable because it exposes that portion of the glazing to the environment. Because of the time and cost involved in replacing the entire window, it would be desirable to repair the window while it remains in place. However, currently there is no practical process for doing so. Thus, practical processes are needed for repairing a window while in place.

BRIEF SUMMARY OF THE INVENTION

The present invention provides for a process for local plasma coating of an edge with the use of a plasma depositing device that operates at atmospheric pressure. The invention also provides for a process to field-repair a plasma coating on plastic glazing.

One embodiment of the invention is a process for repairing substantially transparent plastic glazing comprising an abrasion resistant layer wherein the plastic glazing further comprises a defect or damaged area, and depositing to the defect or damaged area a plasma coating using a plasma depositing device, whereby the defect or damage area is substantially repaired.

In another embodiment of the invention the plastic glazing also comprises a weatherable layer.

In another embodiment of the invention the plastic glazing comprises a thermoplastic polymeric resin.

In another embodiment of the invention the plastic glazing comprises polycarbonate resins, acrylic resins, polyarylate resins, polyester resins, and polysulfone resins, or a copolymer or mixture thereof.

In another embodiment of the invention the plasma depositing device is operated at about atmospheric pressure.

In another embodiment of the invention the plasma coating is formed using a reagent comprising a siloxane.

In another embodiment of the invention a new weatherable layer is applied to the defect or damaged area before the plasma coat is applied.

In another embodiment of the invention is a process for the local application of a plasma coating, to an uncoated edge created by the removal of excess or unwanted plastic from plastic glazing, using a plasma coating device.

In another embodiment of the invention the plasma depositing device is robotically articulated.

In another embodiment of the invention the uncoated edge created by the removal of excess or unwanted plastic from plastic glazing is coated with a weatherable layer before depositing the plasma coating.

In another embodiment of the invention the weatherable layer comprises an acrylic or urethane primer and/or a urethane or siloxane top-coat.

Further areas of applicability will become apparent from the description provided herein. It should be understood that the description and specific examples are intended for purposes of illustration only and are not intended to limit the scope of the present disclosure.

DETAILED DESCRIPTION OF THE INVENTION

Figure 1:
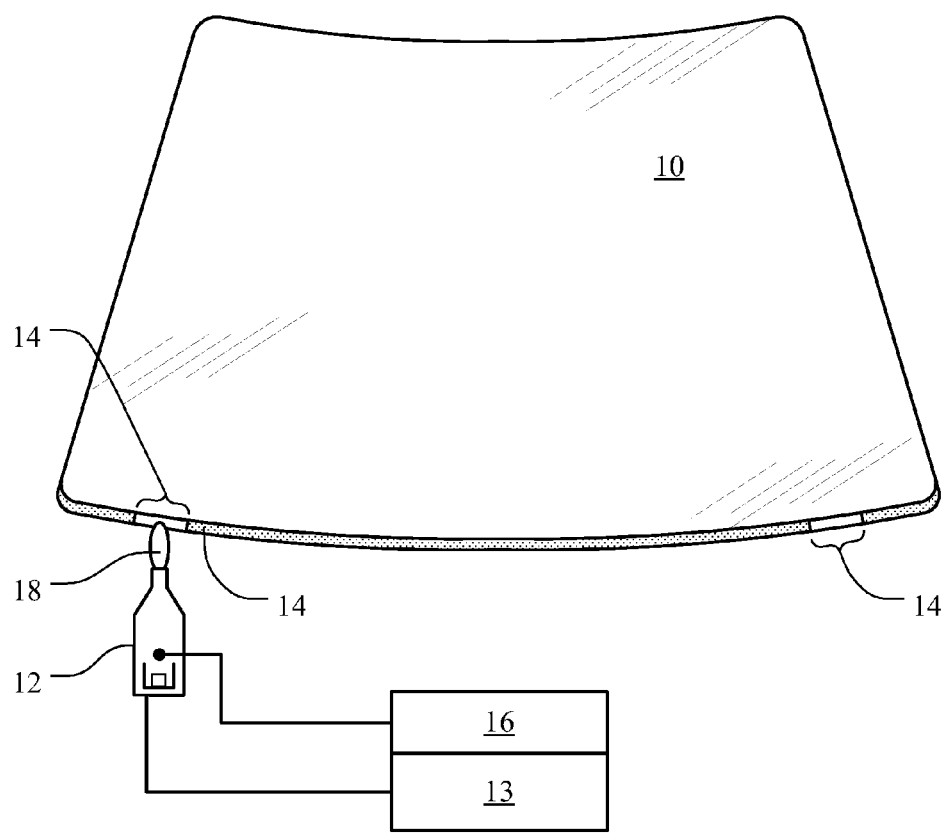
FIG. 1 is a diagrammatic view of a window glazing undergoing edge healing according to the present invention.

As used herein, the term "automobile" means any of a number of types of vehicles powered by a self-contained or remote power plant which can be taken to include but are not limited to at least one of passenger cars, vans and motorcycles, light trucks, heavy duty trucks including off road vehicles, recreational vehicles such as mobile homes and campers, mass transit vehicles such as buses, locomotive vehicles such as trains and other light rail vehicles such as monorails and the like, as well as marine craft and aircraft.

As used herein, "edge healing" means the local application of a plasma coating to the uncoated portion of an edge created by the removal of excess or unwanted plastic from plastic glazing.

As used herein, "field repair" means the local application of a plasma coating for the repair of an automobile window without removing the window from the automobile.

In the manufacture of plastic glazing, generally a plastic substrate is coated with a weatherable layer which is optionally over-coated with an abrasion resistant layer. The plastic substrate may be comprised of a thermoplastic polymeric resin. The thermoplastic resins of the present invention include, but are not limited to, polycarbonate resins, acrylic resins, polyarylate resins, polyester resins, and polysulfone resins, as well as copolymers and mixtures thereof. Transparent plastic glazing may be prepared through the use of any technique known to those skilled in the art, such as molding, thermoforming, or extrusion.

Numerous examples of weatherable layers are known in the art. Weatherable layers may be comprised of, but not limited to, silicones, polyurethanes, acrylics, polyesters, and epoxies, as well as mixtures or copolymers thereof. The weatherable layer preferably includes ultraviolet (UV) absorbing molecules, such as 4,6-dibenzoyl-2-(3-triethoxysilypropl)resorcinol (SDBR), 4,6-dibenzoylresorcinol (DBR), silanated hydroxybenzophenone (SHBP), benzotriaxole, trazine, and more generally such as hydroxyphenyltriazine, hydroxybenzophenones, hydroxylphenylbenzotriazoles, hydroxyphenyltriazines, polyaroylresorcinols, and cyanoacrylates. The weatherable layer may be one homogenous layer or be comprised of multiple sub-layers, such as a primer and a topcoat. A primer typically aids in adhering the topcoat to the plastic panel. The primer for example may include, but not be limited to, acrylics, polyesters, epoxies, and copolymers and mixtures thereof. The topcoat may include, but is not limited to, polymethylmethacrylate, polyvinylidene fluoride, polyvinylfluoride, polypropylene, polyethylene, polyurethane, silicone, polymethacrylate, polyacrylate, polyvinylidene fluoride, silicone hardcoat, and mixtures or copolymers thereof.

Numerous examples of abrasion resistant layers are known in the art. Abrasion resistant layers may be either comprised of one layer or a combination of multiple interlayers of variable composition. The abrasion resistant layer may be applied by any deposition technique known to those skilled in the art, including but not limited to plasma-enhanced chemical vapor deposition (PECVD), expanding thermal plasma PECVD, plasma polymerization, photochemical vapor deposition, ion beam deposition, ion plating deposition, cathodic arc deposition, sputtering, evaporation, hollow-cathode activated deposition, magnetron activated deposition, activated reactive evaporation, thermal chemical vapor deposition, and any known sol-gel coating process.

A specific type of PECVD process, using an expanding thermal plasma reactor (called hereafter as an expanding thermal plasma PECVD process) is described in detail in U.S. patent application Ser. No. 10/881,949 (filed Jun. 28, 2004), published Dec. 29, 2005 as US2005-9284374; and U.S. patent application Ser. No. 11/075,343 (filed Mar. 8, 2005), published Sep. 15, 2005 as US2005-0202184, the entirety of both being hereby incorporated by reference. In an expanding thermal plasma PECVD process, a plasma is generated via applying a direct-current (DC) voltage to a cathode that arcs to a corresponding anode plate in an inert gas environment. The pressure near the cathode is typically higher than about 150 Torr, e.g., close to atmospheric pressure, while the pressure near the anode resembles the process pressure established in the plasma treatment chamber of about 20 mTorr to about 100 mTorr.

The abrasion resistant layer may comprise aluminum oxide, barium fluoride, boron nitride, hafnium oxide, lanthanum fluoride, magnesium fluoride, magnesium oxide, scandium oxide, silicon monoxide, silicon dioxide, silicon nitride, silicon oxy-nitride, silicon oxy-carbide, hydrogenated silicon oxy-carbide, silicon carbide, tantalum oxide, titanium oxide, tin oxide, indium tin oxide, yttrium oxide, zinc oxide, zinc selenide, zinc sulfide, zirconium oxide, zirconium titanate, or a mixture or blend thereof. Preferably, the abrasion resistant layer is comprised of a composition ranging from $SiO_x$ to $SiO_xC_yH_z$ depending upon the amount of carbon and hydrogen atoms that remain in the deposited layer.

Suitable reagents for use in forming the abrasion resistant layer include, but are not limited to, octamethylcyclotetrasiloxane (D4), tetramethyldisiloxane (TMDSO), hexamethyldisiloxane (HMDSO), decamethylcyclopentasiloxane (D5), tetravinyltetramethylcyclotetrasiloxane (V-D4), dimethyldimethoxysilane (DMDMS), vinyltrimethylsilane (VTMS), or another volatile organosilicon compound. The organosilicon compounds are oxidized, decomposed, and polymerized in the plasma deposition equipment.

The present invention provides a process for edge healing of a plastic glazing 10 or the field-repair of a plasma coating on plastic glazing 10 with the use of a plasma depositing device 12 that operates at atmospheric pressure.

The invention offers a means to apply a coating to the affected area 14 that is similar to the plasma coating applied elsewhere, thus providing a common coating with which an appropriate and subsequently applied adhesive or encapsulation will be compatible. Additionally the invention offers a means to repair the defect or damaged area 15 in the plasma coating, while the window 10 remains on the automobile, may help minimize warranty costs and enhance the marketability of polycarbonate windows.

Treatment of the uncoated portion of an edge created by the removal of excess or unwanted plastic from plastic glazing has previously been done with wet coatings only. The wet coating differs from the plasma coating elsewhere on the part. This may lead to variations in coating compatibility with encapsulation or subsequently applied adhesives.

The processes of the invention provide for edge healing and field repair using a plasma depositing device 12 that operates at atmospheric pressure. Generally, such atmospheric pressure devices are known, but used for surface cleaning and activation with a plasma stream resulting from a compressed air and a high frequency discharge. For example, PVA TePla America, Inc. sells a device the PlasmaPen™ that generates a plasma stream under atmospheric conditions and temperatures that are suitable for use in the present invention. Also Plasmatreat™ North America Inc. sells OPENAIR® plasma jets. These devices are generably suitable for use in the present invention.

As seen in FIG. 1, in the present invention the plasma depositing device 12 can be used in a conventional working environment at atmospheric pressure with appropriate reagents 16 for the coating, for example a siloxane coating, being introduced into the plasma stream 18 produced using an inert gas such as argon instead of compressed air and a high frequency discharge 13. Such an atmospheric pressure device may be robotically articulated for edge healing of a plastic glazing. The plasma stream 18 of such a device 12 may be confined to the affected area 14 and to a width that is comparable to that of the width of the edge of the glazing 10 being treated. Prior to edge healing an appropriate wet coating and/or primer is optionally applied to the edge.

Figure 2:
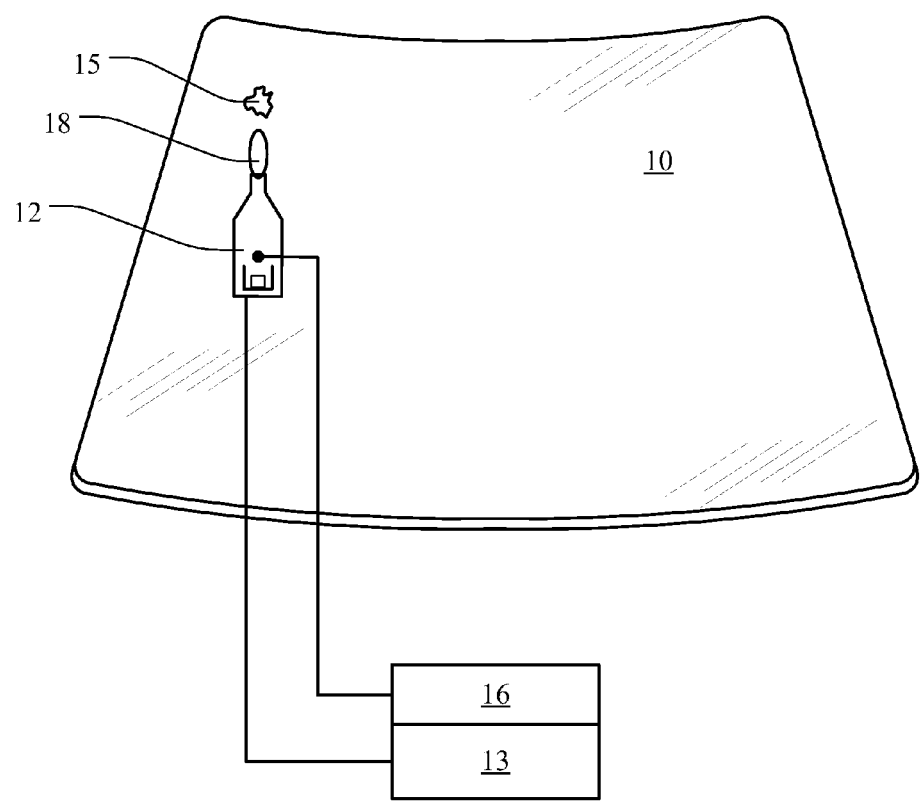
FIG. 2 is a diagrammatic view of a window glazing undergoing field repair according to the present invention.

As seen in FIG. 2, this invention also provides the application of such a device 12 for field repair of a defect or damaged area 15 of a glazing 10. For field repair the device 12 may be hand held and used to repair damage 15 to the original plasma coating on a window using local deposition of a coating compatible with the original coatings and/or the underlying plastic without removing the window from the vehicle. For example, a defect or damaged surface 15 caused by stone impact may be filled in by the plasma coating, for example a siloxane coating 16, to hide the optical defect and to protect the newly exposed surfaces from the environment. Where the defect or damaged area 15 also affects the weatherable layer, a weatherable layer may be applied to the defect or damaged area before the device is used.

The preceding description is merely exemplary in nature and is in no way intended to limit the invention or its application or uses. A person skilled in the art will recognize from the previous description that modifications and changes can be made to the specifically described embodiments of the invention without departing from the scope of the invention as defined in the following claims.

What is claimed is:

1. A process for edge healing of plastic glazing comprising:
    forming a first plasma coating on a substrate to form a coated substrate;
    removing at least one of tabs, gates, and excess plastic from the coated substrate to form an uncoated edge that is not plasma coated, wherein the uncoated edge is at the periphery of the coated substrate; and
    using an atmospheric pressure device to deposit a second plasma coating onto the uncoated edge.

2. The process according to claim 1, wherein the second plasma coating is formed using a reagent comprising a siloxane.

3. The process according to claim 1 wherein the plasma depositing device is robotically articulated.

4. The process of claim 1 further comprising coating the uncoated edge with a weatherable layer before depositing the second plasma coating.

5. The process of claim 4 wherein the weatherable layer comprises an acrylic or urethane primer and/or a urethane or siloxane top-coat.

6. The process according to claim 1, wherein the plastic glazing comprises a polymer selected from the group of polycarbonate resins, acrylic resins, polyarylate resins, polyester resins, and polysulfone resins, as well as copolymers and mixtures thereof.

7. The process according to claim 1, wherein the portion of the edge is an uncoated portion created by the removal of plastic.

8. The process according to claim 1, wherein the application of the second plasma coating is confined to the uncoated edge.

9. The process according to claim 1, wherein the second plasma coating is deposited generally only onto the uncoated edge.

* * * * *